United States Patent
Juengling

(10) Patent No.: US 7,235,480 B2
(45) Date of Patent: *Jun. 26, 2007

(54) SEMICONDUCTOR PROCESSING METHODS OF FORMING INTEGRATED CIRCUITRY AND SEMICONDUCTOR PROCESSING METHODS OF FORMING DYNAMIC RANDOM ACCESS MEMORY (DRAM) CIRCUITRY

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/236,115

(22) Filed: Sep. 26, 2005

(65) Prior Publication Data

US 2006/0024933 A1    Feb. 2, 2006

Related U.S. Application Data

(60) Continuation of application No. 10/851,616, filed on May 20, 2004, now Pat. No. 6,949,430, which is a continuation of application No. 10/243,156, filed on Sep. 12, 2002, now Pat. No. 6,740,583, which is a continuation of application No. 09/879,741, filed on Jun. 11, 2001, now Pat. No. 6,500,738, which is a division of application No. 09/689,237, filed on Oct. 11, 2000, now Pat. No. 6,337,261, which is a continuation of application No. 09/141,776, filed on Aug. 27, 1998, now Pat. No. 6,177,339.

(51) Int. Cl.
*H01L 21/4763* (2006.01)
(52) U.S. Cl. .................... 438/637; 438/700
(58) Field of Classification Search ............... 438/637, 438/510, 700, 20
See application file for complete search history.

(56) References Cited

U.S. PATENT DOCUMENTS

| 4,232,439 A | 11/1980 | Shibata |
| 4,343,657 A | 8/1982 | Ito et al. |
| 4,734,383 A | 3/1988 | Ikeda et al. |

(Continued)

OTHER PUBLICATIONS

*Microchip Fabrication—Second Edition*, McGraw-Hill © 1990, p. 332 only.

(Continued)

*Primary Examiner*—Tuan H. Nguyen
(74) *Attorney, Agent, or Firm*—Wells St. John P.S.

(57) ABSTRACT

Semiconductor processing methods of forming integrated circuitry, and in particular, dynamic random access memory (DRAM) circuitry are described. In one embodiment, a single masking step is utilized to form mask openings over a substrate, and both impurities are provided and material of the substrate is etched through the openings. In one implementation, openings are contemporaneously formed in a photo masking layer over substrate areas where impurities are to be provided, and other areas where etching is to take place. In separate steps, the substrate is doped with impurities, and material of the substrate is etched through the mask openings. In another implementation, two conductive lines are formed over a substrate and a masking layer is formed over the conductive lines. Openings are formed in the masking layer in the same step, with one of the openings being received over one conductive line, and another of the openings being received over the other conductive line. Impurities provided through an opening into the substrate proximate one conductive line, and material from over the other conductive line is removed through the other opening to at least partially form a contact opening over the other conductive line.

8 Claims, 3 Drawing Sheets

U.S. PATENT DOCUMENTS

| | | | | |
|---|---|---|---|---|
| 5,015,594 A | | 5/1991 | Chu et al. | |
| 5,017,506 A | | 5/1991 | Shen et al. | |
| 5,175,120 A | | 12/1992 | Lee | |
| 5,206,187 A | | 4/1993 | Doan et al. | |
| 5,459,085 A | | 10/1995 | Pasen et al. | |
| 5,488,001 A | * | 1/1996 | Brotherton | 438/164 |
| 5,631,182 A | | 5/1997 | Suwanai et al. | |
| 5,637,525 A | | 6/1997 | Dennison | |
| 5,656,520 A | | 8/1997 | Watanabe | |
| 5,668,065 A | | 9/1997 | Lin | |
| 5,686,324 A | | 11/1997 | Wang et al. | |
| 5,731,236 A | | 3/1998 | Chou et al. | |
| 5,731,242 A | | 3/1998 | Parat et al. | |
| 5,766,992 A | | 6/1998 | Chou et al. | |
| 5,780,333 A | | 7/1998 | Kim | |
| 5,795,809 A | | 8/1998 | Gardner et al. | |
| 5,821,140 A | | 10/1998 | Jost et al. | |
| 5,856,227 A | | 1/1999 | Yu et al. | |
| 5,985,711 A | | 11/1999 | Lim | |
| 5,994,228 A | | 11/1999 | Jeng et al. | |
| 6,015,730 A | | 1/2000 | Wang et al. | |
| 6,025,255 A | | 2/2000 | Chen | |
| 6,027,971 A | * | 2/2000 | Cho et al. | 438/257 |
| 6,037,222 A | | 3/2000 | Huang et al. | |
| 6,093,629 A | | 7/2000 | Chen | |
| 6,165,880 A | | 12/2000 | Yaung et al. | |
| 6,177,339 B1 | | 1/2001 | Juengling | |
| 6,337,261 B1 | | 1/2002 | Juengling | |
| 6,395,623 B1 | | 5/2002 | Juengling | |
| 6,635,558 B2 | | 10/2003 | Juengling | |
| 6,949,430 B2 | * | 9/2005 | Juengling | 438/253 |

OTHER PUBLICATIONS

Wolf, Ph.D. et al., Silicon Processing for the VLSI Era—vol. 1—Process Technology, © 1986, p. 283 only.

* cited by examiner

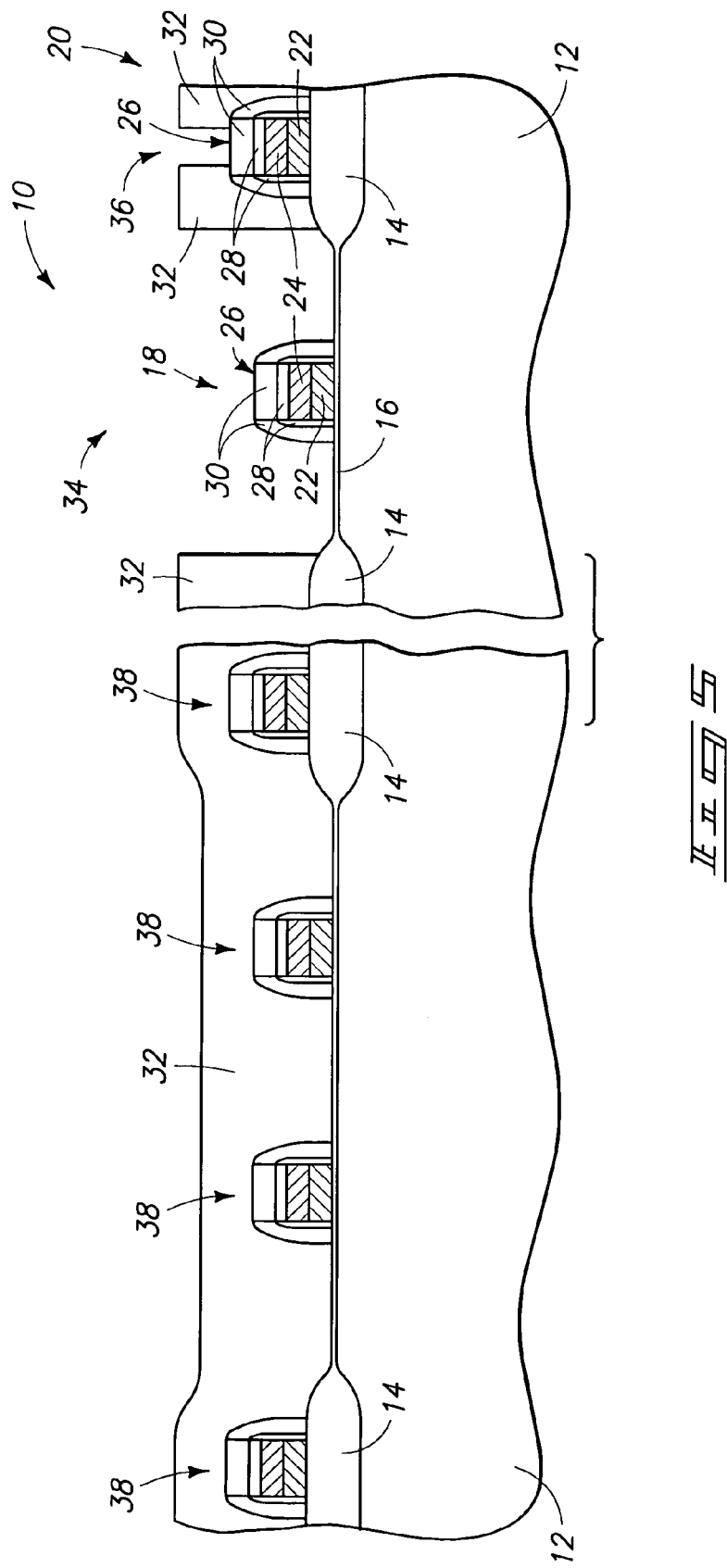

SEMICONDUCTOR PROCESSING METHODS OF FORMING INTEGRATED CIRCUITRY AND SEMICONDUCTOR PROCESSING METHODS OF FORMING DYNAMIC RANDOM ACCESS MEMORY (DRAM) CIRCUITRY

RELATED PATENT DATA

This patent resulted from a continuation application of and claims priority to U.S. patent application Ser. No. 10/851,616, filed May 20, 2004, now U.S. Pat. No. 6,949,430, which issues Sep. 27, 2005, which is a continuation of U.S. patent application Ser. No. 10/243,156 filed on Sep. 12, 2002, now U.S. Pat. No. 6,740,583, which is a continuation of U.S. patent application Ser. No. 09/879,741, filed on Jun. 11, 2001, now U.S. Pat. No. 6,500,738 B2, which is a divisional Application of U.S. patent application Ser. No. 09/689,237, filed Oct. 11, 2000, now U.S. Pat. No. 6,337,261 B1, which is a continuation of U.S. patent application Ser. No. 09/141,776, filed Aug. 27, 1998, now U.S. Pat. No. 6,177,339, the disclosures of which are incorporated by reference.

TECHNICAL FIELD

This invention relates to semiconductor processing methods of forming integrated circuitry and to semiconductor processing methods of forming dynamic random access memory (DRAM) circuitry.

BACKGROUND OF THE INVENTION

Processing of semiconductor devices typically involves many steps which include masking, doping, and etching. Each time one of these steps is performed, certain risks can arise which can jeopardize the integrity of a wafer being processed. For example, a mask misalignment error can cause a subsequent etch to undesirably etch into wafer or substrate structure which can cause catastrophic failure. Accordingly, it is desirable to reduce the number of processing steps utilized in the formation of integrated circuitry.

This invention arose out of concerns associated with reducing the number of processing steps needed in the formation of integrated circuitry. This invention also arose out of concerns associated with improving the manner in which integrated circuitry memory devices, and in particular dynamic random access memory (DRAM) devices are fabricated.

SUMMARY OF THE INVENTION

Semiconductor processing methods of forming integrated circuitry, and in particular, dynamic random access memory (DRAM) circuitry are described. In one embodiment, a single masking step is utilized to form mask openings over a substrate, and both impurities are provided and material of the substrate is etched through the openings. In one implementation, openings are contemporaneously formed in a photo masking layer over substrate areas where impurities are to be provided, and other areas where etching is to take place. In separate steps, the substrate is doped with impurities, and material of the substrate is etched through the mask openings. In another implementation, two conductive lines are formed over a substrate and a masking layer is formed over the conductive lines. Openings are formed in the masking layer in the same step, with one of the openings being received over one conductive line, and another of the openings being received over the other conductive line. Impurities provided through an opening into the substrate proximate one conductive line, and material from over the other conductive line is removed through the other opening to at least partially form a contact opening over the other conductive line.

BRIEF DESCRIPTION OF THE DRAWINGS

Preferred embodiments of the invention are described below with reference to the following accompanying drawings.

FIG. 5 is a diagrammatic sectional view of a semiconductor wafer fragment undergoing processing, in accordance with a preferred embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
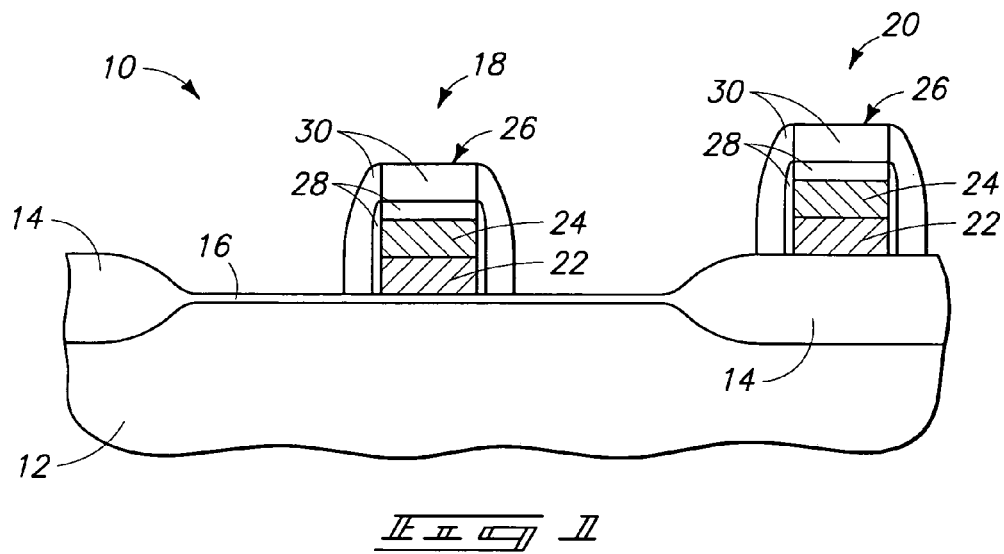
FIG. 1 is a diagrammatic sectional view of a semiconductor wafer in process, in accordance with one aspect of the invention.

Referring to FIG. 1, a semiconductor wafer fragment in process is shown generally at 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Preferably, substrate 12 comprises a bulk monocrystalline substrate.

In the illustrated example, substrate 12 includes a pair of field oxide regions 14 with a thin oxide layer 16, e.g., around 60 Angstroms, extending therebetween. A pair of conductive lines 18, 20 are formed over substrate 12. The two illustrated conductive lines include a polysilicon layer 22 and a silicide layer 24, e.g. $WSi_x$. Insulative material 26 is provided over the conductive lines and preferably covers layers 22, 24. In the illustrated example, insulative material 26 comprises a first insulative material 28 and a second insulative material 30 which is different from first insulative material 28. Preferably, the first and second insulative materials are selected such that one can be etched selectively relative to the other.

In this example, first insulative material 28 comprises an oxide material and second insulative material 30 comprises a nitride material. The first insulative material 28 can be formed to a thickness of around 80 Angstroms over the sidewalls of each conductive line, and to around 300 Angstroms over top portions of the conductive lines. A suitable oxide material for first insulative material 28 is an oxide formed through decomposition of TEOS. Second insulative material 30 can be formed to a thickness over the top portions of conductive lines 18, 20 of around 1900 Angstroms (not shown to scale). An exemplary material for second insulative material 30 is silicon nitride. Of course, other materials, including other oxide and nitride materials are possible for materials 28, 30.

Figure 2:
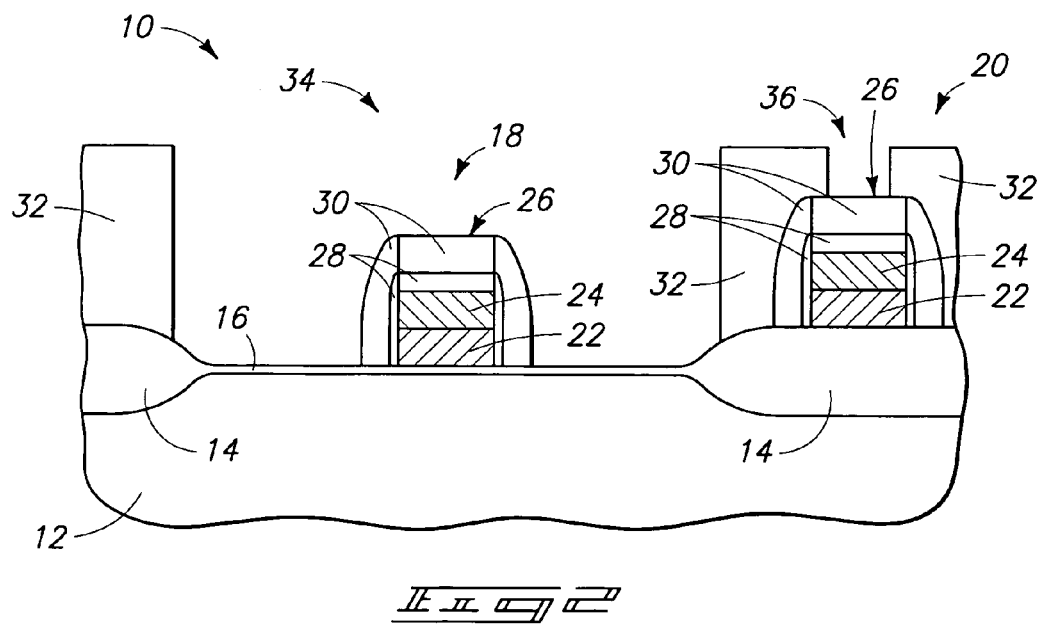
FIG. 2 is a view of the FIG. 1 wafer at a different processing step.

Referring to FIG. 2, a photomasking layer 32 is formed over substrate 12 and conductive lines 18, 20. Masking layer 32 has been patterned to form masking layer openings 34, 36 which are received over conductive lines 18, 20, respectively. The openings are preferably contemporaneously formed. In the illustrated example, opening 34 has a different, larger transverse cross-sectional dimension than opening 36. Opening 34 is dimensioned such that insulative material 26 over conductive line 18 is entirely exposed therethrough, while insulative material 26 over conductive line 20 is only partially exposed through opening 36. Opening 34 is preferably formed over a substrate area where doping impurities are primarily intended to be provided, while opening 36 is formed over a substrate area where etching is primarily intended to take place. Preferably, the etching which is to take place through opening 36 forms a contact opening to conductive line 20, as will become apparent below.

Referring to FIGS. 2 and 5, a preferred embodiment is set forth. There, memory circuitry, such as dynamic random access memory (DRAM) circuitry, is being formed over substrate 12. Accordingly, conductive lines 38 are formed over a memory array area of substrate 12, and other conductive lines 18, 20, are formed over a substrate area comprising a peripheral area proximate the memory array. In the photomasking step just described, the memory array is entirely masked with masking layer 32, and remains so masked during the processing which is described just below. Accordingly, such constitutes keeping the memory array masked with masking layer 32 while forming openings, i.e., openings 34, 36, over the peripheral area.

Figure 3:
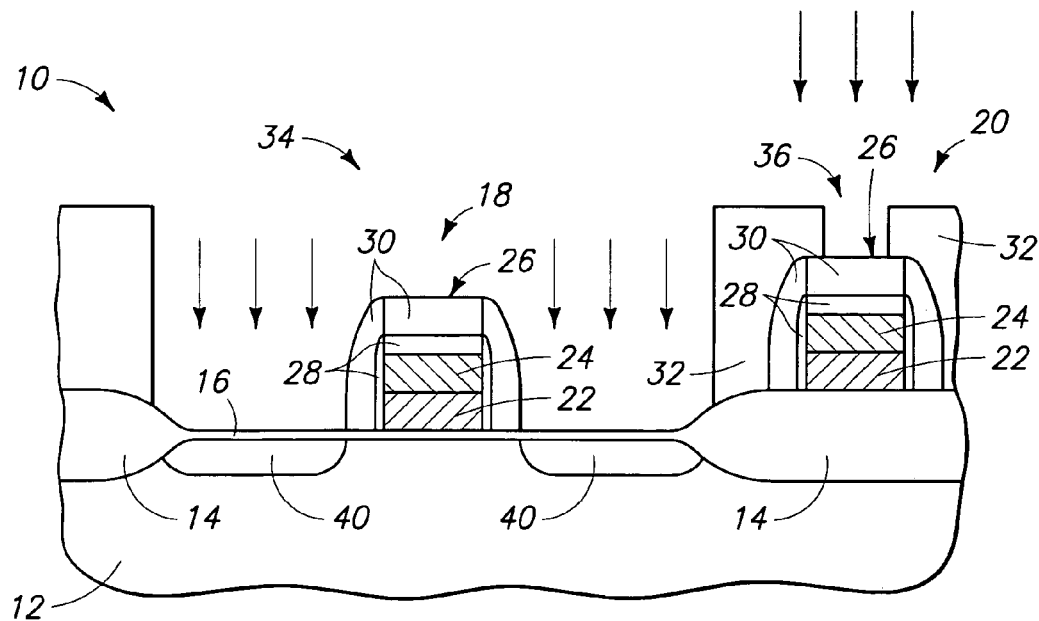
FIG. 3 is a view of the FIG. 2 wafer at a different processing step.

Referring to FIG. 3, doping impurities are provided into substrate 12 proximate conductive line 18 sufficient to form diffusion regions 40. Doping of the substrate preferably comprises providing n+ dopant to form the diffusion regions. Some doping impurities can be received through opening 36 and into insulative material 30, but do not meaningfully affect conductive line 20.

Figure 4:
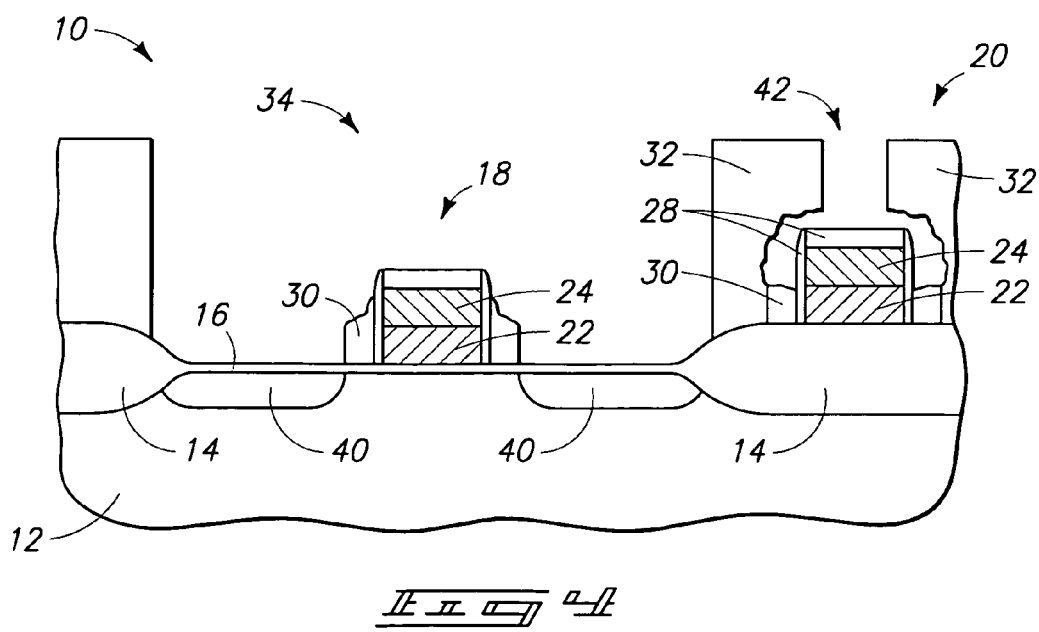
FIG. 4 is a view of the FIG. 3 wafer at a different processing step.

Referring to FIGS. 3 and 4, doping impurities are provided into the substrate through openings 34, 36, and material of the substrate is etched through the openings. In a preferred embodiment, the doping of the substrate takes place prior to, and in a separate step from, the etching of the substrate material. In the illustrated example, the openings are dimensioned to permit some of the doping impurity to be received by the substrate as diffusion regions through only some of the openings. Accordingly, diffusion regions 40 are formed only relative to opening 34 and not opening 36. Of course, doping can take place after the etching of the substrate material through the openings.

Referring to FIG. 4, material of the substrate is etched through all of the openings, e.g., openings 34, 36. Such constitutes removing material from over the conductive lines and, in particular, from over conductive line 20 wherein a contact opening is at least partially formed thereto. Preferably, second insulative material 30 is dry etched selectively relative to first insulative material 28. Exemplary etching conditions include, in the context of a Lam 9400 etcher, a pressure of 20 mTorr, 500 Watts source power, 0 Watts bias power, 40 sccm $SF_6$, and 20 sccm HBr. Such etch conditions can etch nitride at a rate of about 1200 Angstrom/minute and oxide at a rate of about 100 Angstrom/minute. Such etching can take place either anisotropically or isotropically. In the illustrated example, the etching of the second layer comprises an isotropic etch which removes insulative material from the sides of both conductive lines.

The inventive methods can reduce processing complexity by combining, in a single masking step, the doping of impurities into a substrate through openings formed in a mask layer and the etching of material of the substrate through the openings. In a preferred embodiment, the methods are employed in the formation of memory circuitry, and in particular DRAM circuitry. Accordingly, and in the preferred embodiment, processing can now take place to form capacitor constructions over the memory array (FIG. 5).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method of forming integrated circuitry comprising:
   forming a plurality of conductive lines over a substrate, some of the conductive lines being formed over a memory array area of the substrate, other of the conductive lines being formed over a peripheral area of the substrate proximate the memory array area, the other conductive lines having a first insulative material disposed over respective top portions thereof and a different second insulative material over the first insulative material;
   forming a masking layer over the plurality of conductive lines;
   forming two openings through the masking layer over the peripheral area without forming any openings through the masking layer over the memory array area, a first opening being received over a first conductive line, a second opening being received over a second conductive line;
   providing impurity through the first opening and into the substrate proximate the first conductive line and forming diffusion regions within dimensions of the first opening; and
   forming a contact opening underneath the second opening over the second conductive line completely through the second insulative material, but not completely through the first insulative material.

2. The semiconductor processing method of claim 1, wherein the forming of the two openings comprises forming the first opening to have a larger transverse cross-section than the second opening.

3. The semiconductor processing method of claim 1, wherein forming a contact opening comprises additionally forming an opening over the first conductive line completely through the second insulative material, but not completely through the first insulative material.

4. The semiconductor processing method of claim 1, wherein the first and second insulative materials respectively comprise an oxide and a nitride.

5. A semiconductor processing method of forming integrated circuitry comprising:
- forming a plurality of conductive lines over a substrate, the conductive lines having a first insulative material disposed over respective top portions thereof and a different second insulative material over the first insulative material;
- forming a masking layer over the plurality of conductive lines;
- forming two openings through the masking layer, a first opening being received over a first conductive line, a second opening being received over a second conductive line;
- providing impurity through the first opening and into the substrate proximate the first conductive line and forming diffusion regions within dimensions of the first opening; and
- forming a contact opening underneath the second opening over the second conductive line completely through the second insulative material, but not completely through the first insulative material.

6. The semiconductor processing method of claim 5, wherein the forming of the two openings comprises forming the first opening to have a larger transverse cross-section than the second opening.

7. The semiconductor processing method of claim 5, wherein forming a contact opening comprises additionally forming an opening over the first conductive line completely through the second insulative material, but not completely through the first insulative material.

8. The semiconductor processing method of claim 5, wherein the first and second insulative materials respectively comprise an oxide and a nitride.

* * * * *